United States Patent
Hashimoto (10) Patent No.: US 6,506,980 B2
(45) Date of Patent: Jan. 14, 2003

(54) SEMICONDUCTOR DEVICE AND TAPE CARRIER, AND METHOD OF MANUFACTURING THE SAME, CIRCUIT BOARD, ELECTRONIC INSTRUMENT, AND TAPE CARRIER MANUFACTURING DEVICE

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/768,165

(22) Filed: Jan. 24, 2001

(65) Prior Publication Data

US 2001/0039076 A1 Nov. 8, 2001

Related U.S. Application Data

(62) Division of application No. 09/358,537, filed on Jul. 22, 1999, now Pat. No. 6,200,824.

(30) Foreign Application Priority Data

Jul. 31, 1998 (JP) ............................................ 10-230342
Jun. 4, 1999 (JP) ............................................ 11-158279

(51) Int. Cl.⁷ ................................................. H01R 9/09
(52) U.S. Cl. ........................ 174/261; 174/255; 174/260; 257/668; 257/797
(58) Field of Search ................................. 174/261, 260, 174/255; 257/668, 797; 361/813, 750

(56) References Cited

U.S. PATENT DOCUMENTS

| | | | |
|---|---|---|---|
| 5,153,708 A | * 10/1992 | Ohikata et al. | 257/668 |
| 5,427,641 A | 6/1995 | Muramatsu et al. | 156/252 |
| 5,453,699 A | 9/1995 | Makishita et al. | 324/754 |
| 5,506,444 A | 4/1996 | Chikawa et al. | 257/666 |
| 5,528,078 A | 6/1996 | Shin | 257/676 |
| 5,686,757 A | * 11/1997 | Urushima | 257/668 |
| 5,767,107 A | 6/1998 | Ouchi et al. | 361/792 |
| 5,825,081 A | * 10/1998 | Hosomi et al. | 257/668 |
| 5,887,343 A | * 3/1999 | Salatino et al. | 29/833 |
| 5,970,320 A | 10/1999 | Yamasaki et al. | 438/123 |
| 6,007,729 A | 12/1999 | Endoh | 216/14 |
| 6,079,470 A | 6/2000 | Piclke et al. | 156/523 |
| 6,100,113 A | 8/2000 | Wang | 438/107 |
| 6,100,589 A | * 8/2000 | Tanaka | 257/758 |
| 6,130,110 A | 10/2000 | Hashimoto | 438/106 |
| 6,201,193 B1 | * 3/2001 | Hashimoto | 174/260 |

FOREIGN PATENT DOCUMENTS

JP 3-104252 A 5/1991

* cited by examiner

*Primary Examiner*—Albert W. Paladini
(74) *Attorney, Agent, or Firm*—Oliff & Berridge, PLC (57) ABSTRACT

A method of manufacturing a tape carrier comprises: a step of providing a tape carrier having bonding portions formed in rows in the width direction, repeating in the longitudinal direction, and having identification marks delimiting regularly repeating matrices formed of pluralities of rows and columns of the bonding portions; a step of examining the tape carrier; a step of removing a defective location of the tape carrier detected in the examination step, and joining together the separated tape carrier to preserve the regular repetition of the matrix; and a step of forming a join mark for delimiting a matrix in which the join formed in the joining step is positioned.

6 Claims, 11 Drawing Sheets

SEMICONDUCTOR DEVICE AND TAPE CARRIER, AND METHOD OF MANUFACTURING THE SAME, CIRCUIT BOARD, ELECTRONIC INSTRUMENT, AND TAPE CARRIER MANUFACTURING DEVICE

This is a Division of application Ser. No. 09/358,537 filed Jul. 22, 1999, now U.S. Pat. No. 6,200,824 issued Mar. 13, 2001.

BACKGROUND OF THE INVENTION

1. Field of the Invention

The present invention relates to a semiconductor device and tape carrier, and a method of manufacturing the same, to a circuit board, an electronic instrument, and a tape carrier manufacturing device.

2. Description of Related Art

In recent years, with the increasingly compact nature of electronic instruments, there has been a large demand for compact semiconductor devices in which CSP (Chip Scale/Size Package) technology is applied. For the manufacture of such compact semiconductor devices, TAB (Tape Automated Bonding) technology can be applied. Since TAB technology can be carried out using a tape carrier in a reel-to-reel process, it is appropriate to quantity production of semiconductor devices.

However, TAB technology was not developed with semiconductor devices as compact as those of today in mind, and there is therefore further room for improvement.

For example, a semiconductor device fabricated with the application of conventional TAB technology has outer leads as external electrodes, whereas in CSP, solder balls are used as external electrodes. A method which exploits the features of TAB technology, while efficiently providing solder balls has not yet been developed.

If there should be a fault in a part of the tape carrier, which requires a very fine interconnect pattern, it is necessary to remove the bad portion and join the remainder together. On a tape carrier with a dense interconnect pattern, the cutting must be carried out on the interconnect pattern, and at the join, adhesive tape or the like is provided for the joining. Therefore, the mounting of a semiconductor chip or the formation of solder balls cannot be carried out at the join, but a reel-to-reel process is carried out continuously, and as a result it has not been possible to avoid just this area.

SUMMARY OF THE INVENTION

The present invention solves these problems, and has as its object the provision of a method of efficiently manufacturing a semiconductor device, a semiconductor device manufactured by this method, a tape carrier used in this method and a method of manufacture thereof, a circuit board, an electronic instrument, and a tape carrier manufacturing device.

(1) A method of manufacturing a tape carrier as one aspect of the present invention comprises:

an examination step in which a tape carrier having a bonding portion formed in a matrix form and at least one type of identification mark is examined;

a step of removing a portion which includes a defective location detected in the examination step, and then joining together remaining portions of the tape carrier after the removal; and a step of forming a join mark delimiting a matrix in which a join formed in the joining step is positioned.

In this aspect of the present invention, to one bonding portion, one semiconductor chip is connected. A bonding portion refers to the portion to which an individual semiconductor chip is connected. For example, it may include lands for connecting the electrodes of the semiconductor chip, lands for forming external electrodes, and interconnects connecting these lands.

According to this aspect of the present invention, in the width direction of the tape carrier, a plurality of bonding portions is formed in a row, and therefore in the width direction a plurality of semiconductor chips can be mounted, and the semiconductor device can be fabricated in quantity. The manufacturing process can be advanced for each matrix delimited by the identification mark.

Further, in this aspect of the present invention, a defective location discovered by the examination of the tape carrier is cut out from the tape carrier, thus tape carrier is separated. The separated tape carrier is then rejoined again. As a result, a join is formed in the tape carrier, but the matrix in which this join is positioned is shown by a join mark. Therefore, by carrying out subsequent processes excluding the matrix delimited by the join mark, flowing of the solder balls by the adhesive tape or the like provided on the join can be prevented. In this way, efficient quantity production of the semiconductor device is possible.

(2) In this manufacturing method, the join mark may be formed by punching out the identification mark.

(3) In this manufacturing method, the identification mark may be formed simultaneously with the bonding portion, the identification mark being formed of the same material and by the same method as the bonding portion.

By this means, the identification mark can be formed simply, without increasing the number of steps.

(4) In this manufacturing method, the tape carrier may have at least two types of the identification mark of different forms which are detected by different examination means.

(5) A method of manufacturing a semiconductor device as another aspect of the present invention comprises:

an examination step in which a tape carrier having a plurality of bonding portions formed in a matrix form and at least two types of identification marks is examined;

a step of removing a portion which includes a defective location detected in the examination step, and then joining together remaining portions of the tape carrier after the removal;

a step of forming a join mark delimiting a matrix in which a join formed in the joining step is positioned; and a step of electrically connecting each of the plurality of bonding portions to a corresponding of a plurality of semiconductor chips, excluding a region delimited by the join mark.

According to this aspect of the present invention, in the width direction of the tape carrier, a plurality of bonding portions is formed in a row. A semiconductor chip is mounted on each bonding portion, so that a plurality of semiconductor chips are mounted in the width direction, and the semiconductor device can be fabricated in quantity.

The manufacturing process can be advanced for each matrix delimited by the identification marks.

In this aspect of the present invention, a defective location discovered by the examination of the tape carrier is cut out from the tape carrier, thus tape carrier is separated. The separated tape carrier is then rejoined. As a result, a join is formed in the tape carrier, but the matrix in which this join is positioned, is indicated by a join mark. Then, excluding the matrix delimited by the join mark, a semiconductor chip is mounted on each bonding portion.

(6) This method of manufacturing a semiconductor device may further comprise:

a step of excluding the region delimited by the join mark, and forming a plurality of external electrodes simultaneously for the plurality of semiconductor chips for each matrix.

By means of this, for each matrix, a plurality of external electrodes is formed simultaneously for each of the plurality of semiconductor chips. By forming the external electrodes simultaneously for the plurality of semiconductor chips, the adaptability to quantity production is improved. This step is carried out excluding the region delimited by the join mark. Therefore, flowing of the solder balls by the adhesive tape or the like provided on the join can be prevented. In this way, efficient quantity production of the semiconductor device is possible.

(7) In this method of manufacturing a semiconductor device, the forms of the at least two types of identification marks may be different, and the identification marks may be detected by different examination means.

(8) A tape carrier as further aspect of the present invention has bonding portions formed in a matrix form on a substrate, and identification marks which delimit the bonding portions regularly in pluralities of rows and columns are formed.

According to this aspect of the present invention, in the width direction of the tape carrier, a plurality of bonding portions is formed in a row, and in the width direction a plurality of semiconductor chips can be mounted, and the semiconductor device can be fabricated in quantity. The manufacturing process can be advanced for each matrix delimited by the identification marks.

(9) In the tape carrier of this aspect of the present invention, a join may be formed by connecting together remaining portions caused by cutting; and a join mark may be formed in a delimited portion including the join.

Further, in this aspect of the present invention, a defective location discovered by the examination of the tape carrier is cut out from the tape carrier, thus tape carrier is separated. The separated tape carrier is then rejoined, so that a join is formed in the tape carrier. The matrix in which the join is positioned is indicated by a join mark. Therefore, by carrying out subsequent processes excluding the matrix delimited by the join mark, flowing of the solder balls by the adhesive tape or the like provided on the join can be prevented. In this way, efficient quantity production of the semiconductor device is possible.

(10) In the tape carrier of this aspect of the present invention, the join mark may be formed by punching out any of the identification marks.

By this means, a join mark can be formed easily, and the identification marks and join marks can be recognized simultaneously.

(11) In the tape carrier of this aspect of the present invention, there may be at least two types of the identification marks of different forms, and the identification marks may be detected by different examination means.

(12) A semiconductor device as yet further aspect of the present invention is manufactured by the above-described method.

(13) A circuit board as yet further aspect of the present invention has the above-described semiconductor device which is mounted thereon.

(14) An electronic instrument as yet further aspect of the present invention has the above-described circuit board.

(15) A tape carrier manufacturing device as yet further aspect of the present invention comprises:

carrying means for carrying a tape carrier having a plurality of identification marks; and a plurality of detection means for detecting the plurality of identification marks, wherein the plurality of detection means are detection devices detecting the identification marks by different detection methods.

(16) In this tape carrier manufacturing device:

one of the plurality of detection means may be a detection device for detecting by means of light.

(17) In this tape carrier manufacturing device:

one of the plurality of detection means may be a detection device for detecting by means of image processing.

By means of this, identification can be possible by means of an identification mark capable of visual recognition.

(18) In this tape carrier manufacturing device:

one of the plurality of detection means may be a detection device for detecting by means of a pin.

By means of this, identification can be possible by means of an identification mark capable of mechanical recognition.

DETAILED DESCRIPTION OF THE PREFERRED EMBODIMENT

The present invention is now described in terms of a preferred embodiment, with reference to the drawings. The present embodiment relates to the method of manufacturing a semiconductor device to which the present invention is applied, and is described divided into the process up to the fabrication of a tape carrier and the process after the fabrication of a tape carrier.

Process up to the Fabrication of a Tape Carrier:

FIGS. 1 to 6 show steps in the process up to the fabrication of a tape carrier in the method of manufacturing a semiconductor device to which the present invention is applied.

Figure 1:
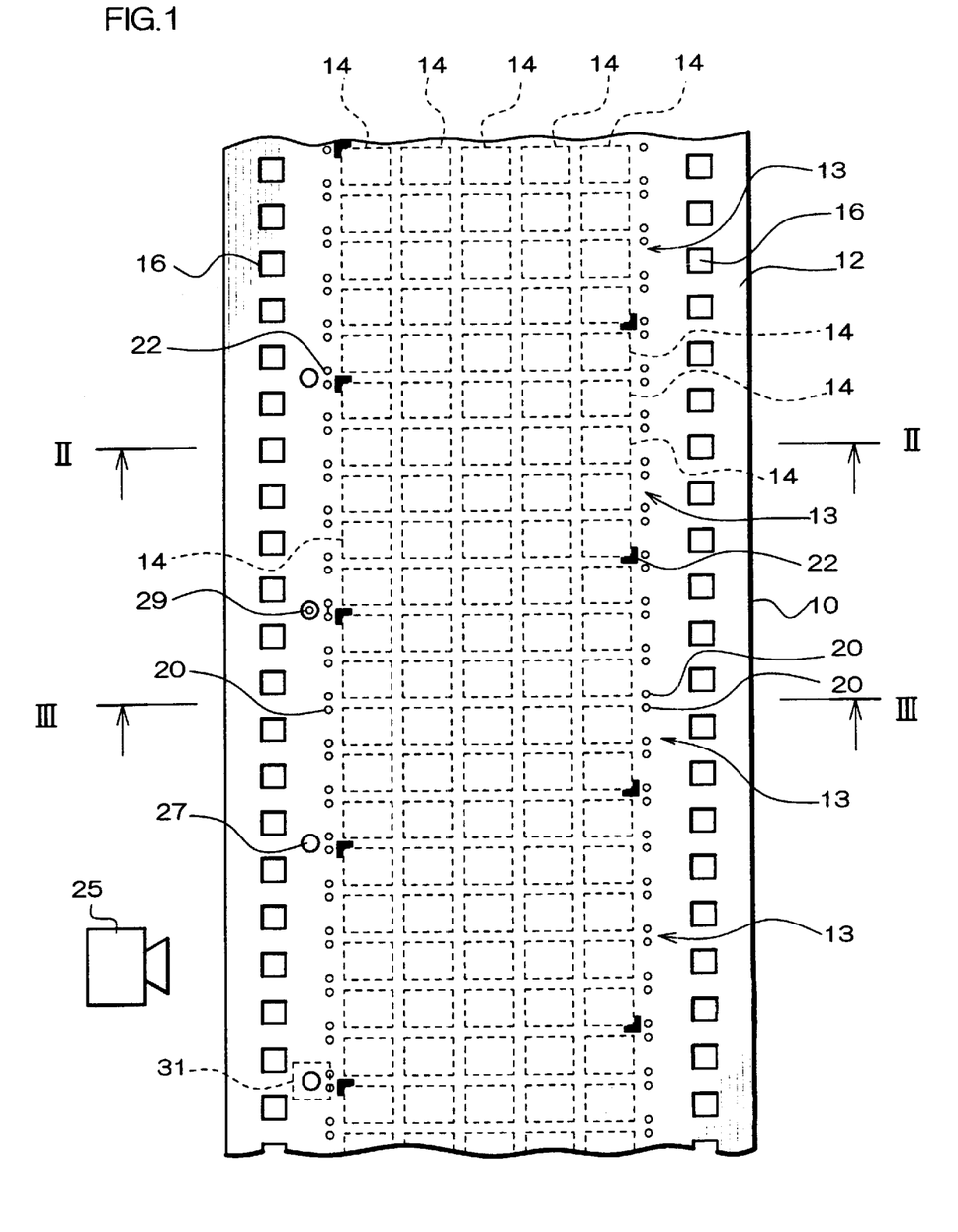
FIG. 1 shows a step in the process up to the fabrication of a tape carrier in the method of manufacturing a semiconductor device of the present invention.
Figure 2:
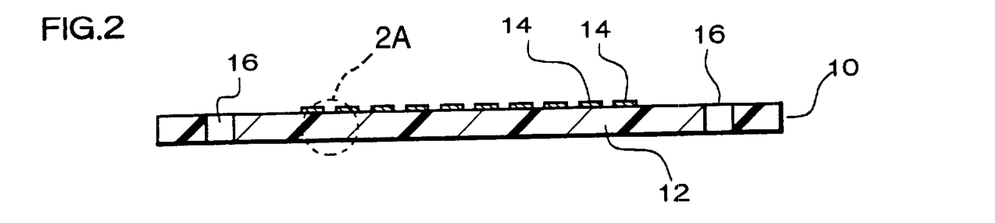
FIG. 2 shows a step in the process up to the fabrication of a tape carrier in the method of manufacturing a semiconductor device of the present invention.
Figure 2A:
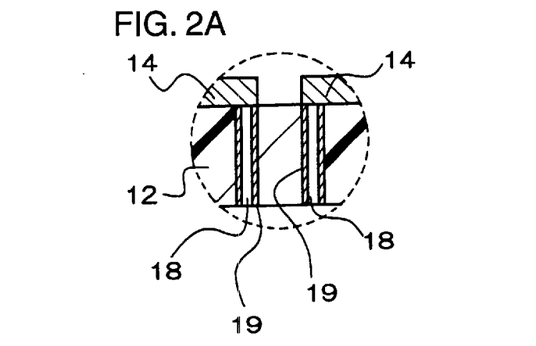
Figure 3:
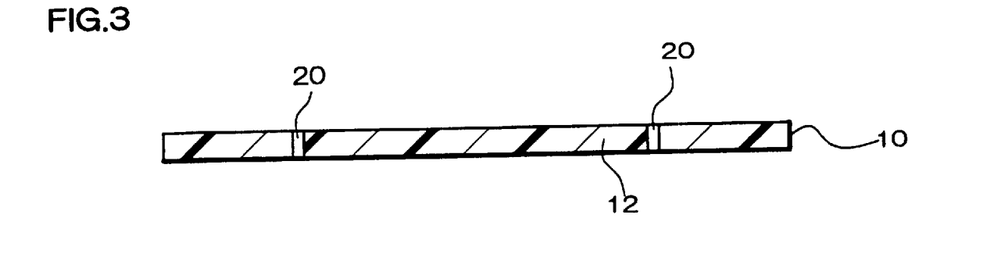
FIG. 3 shows a step in the process up to the fabrication of a tape carrier in the method of manufacturing a semiconductor device of the present invention.

In the present embodiment, a tape carrier 10 shown in FIG. 1 is used. FIG. 2 is a section along the line II—II in FIG. 1, and FIG. 3 is a section along the line III—III in FIG. 1. In the drawings, the thickness and size of materials are not shown to scale, for the purposes of description, and the present invention is not limited by their proportions.

The tape carrier 10 comprises a substrate 12 in a strip or tape form, and a plurality of bonding portions 14 formed on at least one surface of the substrate 12, and is provided wound around a reel not shown in the drawings. It should be noted that the tape carrier 10 may equally be a three-layer tape, in which the bonding portions 14 are formed by etching or the like after adhering a conductive foil such as copper foil or the like to the substrate 12 with adhesive, or a two-layer tape in which adhesive is not used. In a two-layer tape, a conductive film of copper or the like is deposited on the substrate by sputtering or the like. Then this is etched to form the bonding portions 14, or alternatively, on a conductive foil such as a copper foil, a varnish such as a polyimide resin to form the substrate is applied and cured, after which the bonding portions 14 are formed.

The substrate 12 can be formed from an organic or resin material as generally used for a tape carrier, but the material is not limited as long as it has flexibility. Rather than a three-layer tape, a two-layer tape with no adhesive generally has superior flexibility. Further, to increase the flexibility, by utilizing TAB processing or the like, partial punching, overhang, or the like may be added.

At both side edges of the substrate 12 in the width direction, sprocket holes 16 are formed along continuously in the longitudinal direction. The sprocket holes 16 are arranged so as to mesh with sprockets not shown in the drawings when the tape carrier 10 is wound up or fed out.

As shown in enlargement in FIG. 2, through holes 18 are formed in the substrate 12. Normally, a part of the solder balls formed on the opposite surface to that on which the bonding portions 14 are formed (the second surface) enters the through hole, providing an electrical conductivity between the bonding portions 14, and the solder balls and second surface on which the solder balls are exposed. As another example, as shown in FIG. 2, on the inside surfaces of the through holes 18 an electrically conducting material 19 such as gold or copper is plated, and in the opening the bonding portions 14 may be electrically connected to the electrically conducting material 19. By this means, an electrical connection is obtained from the bonding portions 14 formed on the one surface of the substrate 12 through the electrically conducting material 19 of the through holes 18, and solder balls 38 (see FIG. 10) may be formed on the second surface. Together with this, bonding portions and lands to receive solder balls may also be formed on the second surface, thus adopting a double-sided substrate.

The bonding portions 14 are formed with a plurality in the width direction of the substrate 12, repeatedly in the longitudinal direction of the substrate 12. To each bonding portion 14, a semiconductor chip 32 (see FIG. 8A) is connected. The bonding portions 14 are portions for connecting individual semiconductor chips 32, and for example, include lands for connecting electrodes 34 of a semiconductor chip 32, lands for forming external electrodes 38 (see FIG. 10), and interconnects connecting these lands. It should be noted that in FIG. 1, are shown only the region in which bonding portions 14 are formed, and further detail is omitted. Each of these bonding portions 14 has an interconnect pattern and lands formed for individual semiconductor chips 32 (see FIG. 8A). Therefore, in the present embodiment, since a plurality of the bonding portions 14 is formed in the width direction of the substrate 12, a plurality of the semiconductor chips 32 is mounted in the width direction of the substrate 12. Since the bonding portions 14 are formed repeatedly in the longitudinal direction of the substrate 12, the semiconductor chips 32 are mounted repeatedly in the longitudinal direction of the substrate 12.

On the substrate 12, as shown in FIG. 3, positioning holes 20 are formed for the purpose of identifying the positions of the bonding portions 14. In more detail, the bonding portions 14 are aligned in a row in the width direction of the substrate 12, and the positioning holes 20 are formed further on the outside of both of the outermost of these bonding portions 14. Adjacent to two corners of a bonding portion 14 is formed a pair of the positioning holes 20. By means of the thus-formed positioning holes 20, the position of the bonding portions 14 aligned in a row in the width direction of the substrate 12 can be identified.

On the substrate 12, as shown in FIG. 1, pairs of identification marks 22 are formed. The identification marks 22 are arranged to delimit a matrix 13 formed of a plurality of rows and a plurality of columns of the bonding portions 14, to allow identification. In the present embodiment, four in the longitudinal direction of the substrate 12, and five in the width direction of the substrate 12, that is, 4×5 of the bonding portions 14 form the matrix 13. To delimit the matrix 13, a pair of L-shaped identification marks 22 is formed.

The above-described identification marks 22 can be detected visually (by imaging), but may be unsuitable for detection by a detecting device. In this case, identification marks 27, which can be mechanically identified, may be formed. For example, by means of holes, identification marks 27, which can be mechanically identified, may be formed. In this case, the presence of the identification marks 27 can be detected by detection pins or the passage of a light beam.

A tape carrier manufacturing device preferably includes a carrying means for carrying the tape carrier 10 (for example the reel 24 shown in FIG. 4), a examination device for identifying the identification marks 22 by image processing (for example a camera 25), pins 29 for detecting the identification marks 27, an examination device for optically detecting the identification marks 27 (for example a photoreceptor element 31), and so forth.

A pair of identification marks 22 delimits a matrix 13 in a regularly repeated manner. For example, a pair of identification marks 22 skips a row of the bonding portions 14 extending in the width direction of the substrate 12, to delimit the matrix 13. In other words, between the matrix 13 delimited by a pair of identification marks 22 and the adjacent matrix 13 delimited by another pair of identification marks 22, a row of the bonding portions 14 extending in the width direction remains. Taking any row of the bonding portions 14 in the width direction of the tape carrier 10 as the reference point, the rows of the bonding portions 14 in the width direction which are outside this section are those rows numbered a natural number n multiplied by a constant k in the longitudinal direction. For example, in the present embodiment shown in FIG. 1:

k=5

Therefore, based on any one row of the bonding portions 14, the rows of bonding portions 14 numbered 5, 10, 15, 20, and so on in the longitudinal direction are outside the delimit of the pairs of identification marks 22.

These rows of the bonding portions 14 outside the delimits can be used as cutting regions, but in the present embodiment, this is not in particular necessary. Therefore, the matrices 13 may be delimited without skipping rows of bonding portions 14.

The number of bonding portions 14 configuring the matrix 13 delimited by a pair of the identification marks 22 and the form of the identification marks 22 can be determined freely. When a two-layer tape is used, the identification marks 22 can be formed at the same time as the formation of bonding portions 14, of the same material as the bonding portions 14.

Next, the above-described tape carrier 10 is subjected to an examination process. In this examination process, defective bonding portions 14 and so forth are detected. Then when a tape carrier defect spanning a number of products is detected, the defective locations are cut out.

Figure 4:
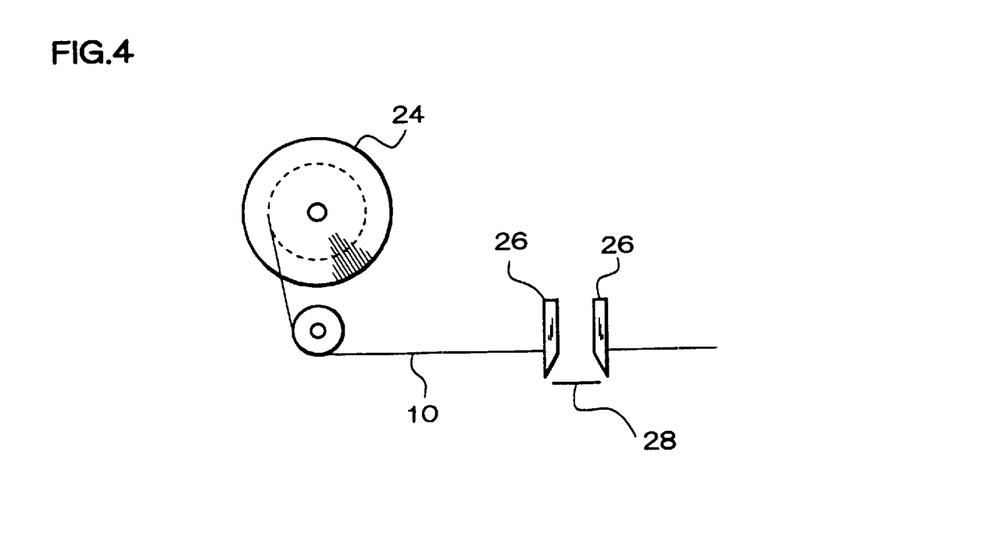
FIG. 4 shows a step in the process up to the fabrication of a tape carrier in the method of manufacturing a semiconductor device of the present invention.
Figure 5:
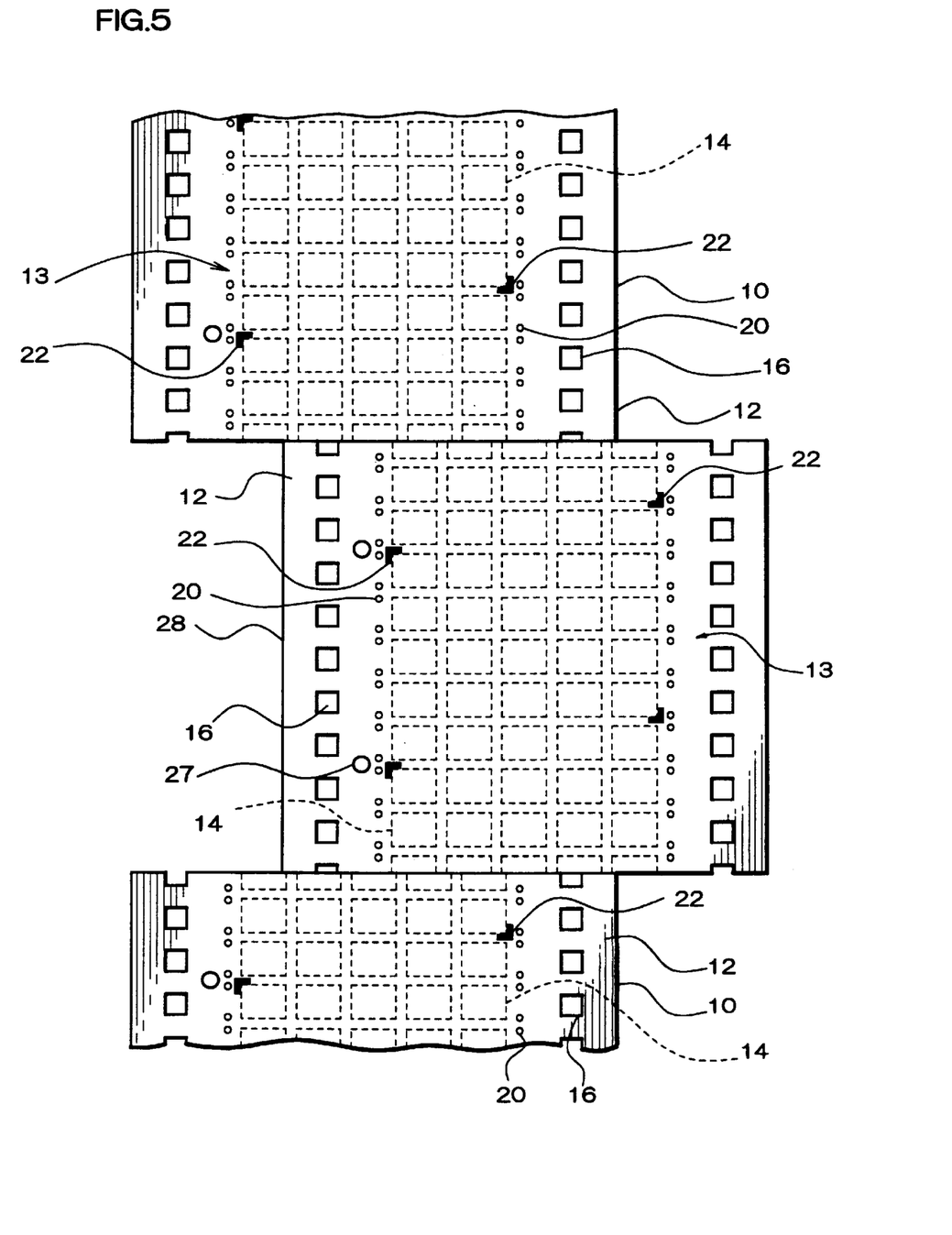
FIG. 5 shows a step in the process up to the fabrication of a tape carrier in the method of manufacturing a semiconductor device of the present invention.

FIG. 4 shows the process of cutting out a defective location which has been discovered in the examination. As shown in this figure, the tape carrier 10 is wound around a reel 24. Then the tape carrier 10 is unwound from the reel 24, and by means of a cutting tool 26 such as a cutter, a defective location 28 is cut out. In FIG. 5 is shown the step in which the defective location 28 is removed from the tape carrier 10. As shown in FIG. 5, the defective location may be removed in a single operation using two cutting tools, or equally a single cutting tool may be used twice to remove the defective location.

In this cutting process, within the region delimited by a pair of identification marks 22, the tape carrier 10 is cut. In more detail, the cutting is carried out so that when the tape carrier 10, which has been cut, is joined back together, the regular repetition of the matrix 13 is preserved. That is to say, when the tape carrier 10 is cut in two locations in order to remove the defective location 28, the tape carrier 10 is cut so that the identification mark 22 closest to one cut edge and the identification mark 22 closest to the other cut edge delimit the above-described matrix 13. Moreover, in the present embodiment, a row of the bonding portions 14 is disposed between adjacent matrices 13. By this means, while the regular repetition of the matrix 13 is maintained, the subsequent regular processes, in particular the tape-to-reel process can be carried out.

Figure 6:
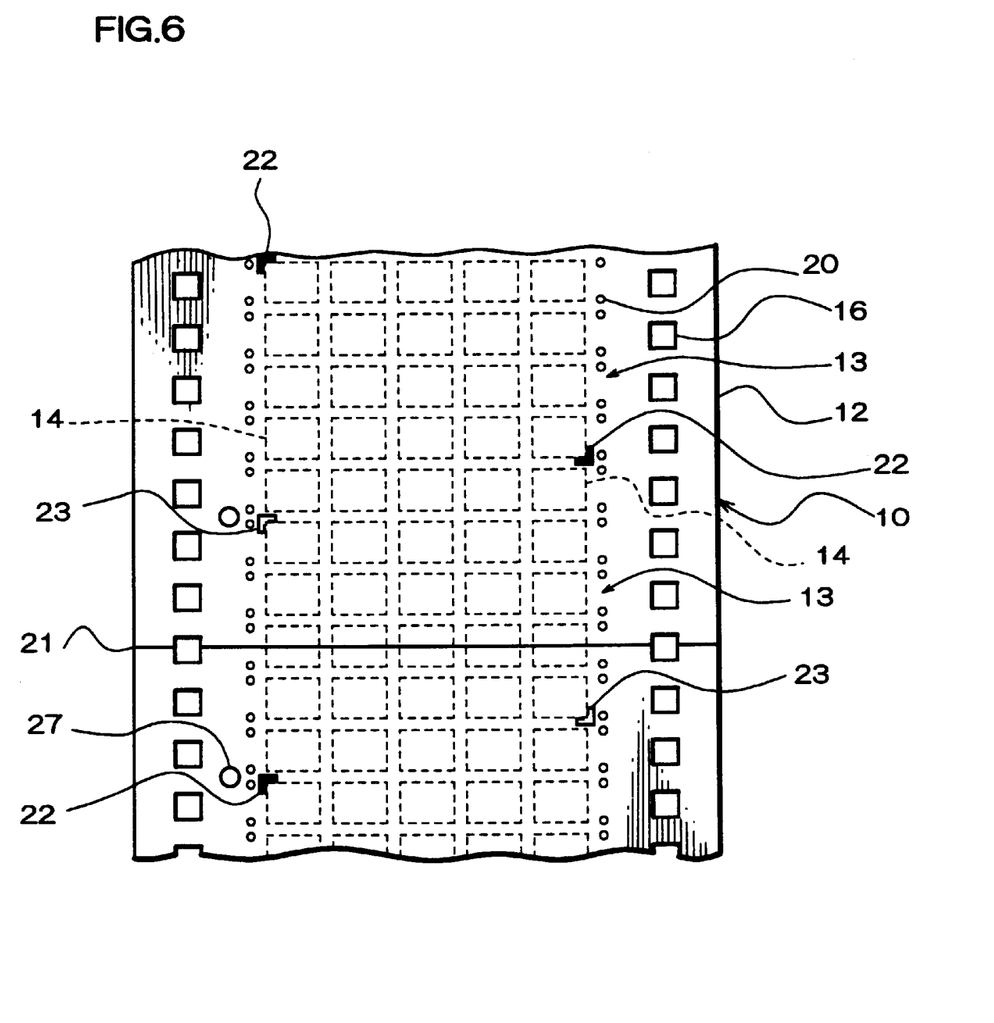
FIG. 6 shows a step in the process up to the fabrication of a tape carrier in the method of manufacturing a semiconductor device of the present invention.

Next, as shown in FIG. 6, the tape carrier 10, which has been cut, is joined. In more detail, the defective location 28 shown in FIG. 5 is removed out from the tape carrier 10. The edges of the remaining portions of the tape carrier 10 are joined together, by applying an adhesive tape (not shown) or the like. By joining the remaining portions without overlapping, and applying adhesive tape to at least either the front or back surface, no step is created in the substrate 12 of the tape carrier 10. In general, the location where the adhesive tape is applied and the surroundings thereof no longer function as a mounting substrate.

With a tape carrier 10 joined in this way, joins 21 are formed. In the present embodiment, in order to make the joins 21 easier to identify, join marks 23 are formed. The join marks 23 can be formed, for example, by punching out identification marks 22. In this case, the join marks 23 also function as identification marks 22. It should be noted that the join marks 23 may be formed after the tape carrier 10 which has been cut has been joined, or may be formed first. For example, as shown in FIG. 5, after the defective location 28 has been cut away from the tape carrier 10, before the tape carrier 10 is joined back together, join marks 23 may be formed. Alternatively, in the examination process, after a defective location has been found and before cutting, the position of the join may be determined and the join marks 23 may be formed.

By attaching the join marks 23 in this way, and detecting the join marks 23 with for example an optoelectric sensor, and in subsequent processes the joins 21 can be automatically and mechanically detected. In other words, a matrix, which cannot be used for mounting, can be recognized.

The tape carrier 10 which has been joined back together has the matrix 13 positioned at a join 21 similar to the other matrices 13, with a 4×5 array of the bonding portions 14. Further, the formation of one row of the bonding portions 14 between two adjacent matrices 13 ensures that no irregular intervals are formed. That is to say, the tape carrier 10 is exactly the same as the tape carrier 10 shown in FIG. 1, except that the joins 21 connected by adhesive tape or the like are formed, and the presence of these joins 21 is shown by join marks 23 being formed.

It should be noted that the tape carrier 10 may employ, in place of the above-described two-layer or three-layer tape, a double-sided interconnect tape, a built-up interconnect tape, a glass-epoxy tape, or any other means, provided that it is capable of being supplied from a reel. In other words, as long as the material of the tape has sufficient flexibility to be wound around a reel and is a material such that the interconnects can be formed, any material can be used.

Process After the Fabrication of a Tape Carrier

Next, FIGS. 7 to 13 show steps in the process after the fabrication of a tape carrier in the method of manufacturing a semiconductor device to which the present invention is applied.

First, on the tape carrier 10 which has, as described above, been subject to examination, removal of defective locations 28 (see FIG. 5), and rejoining, an anisotropic conductive film is provided.

Figure 7:
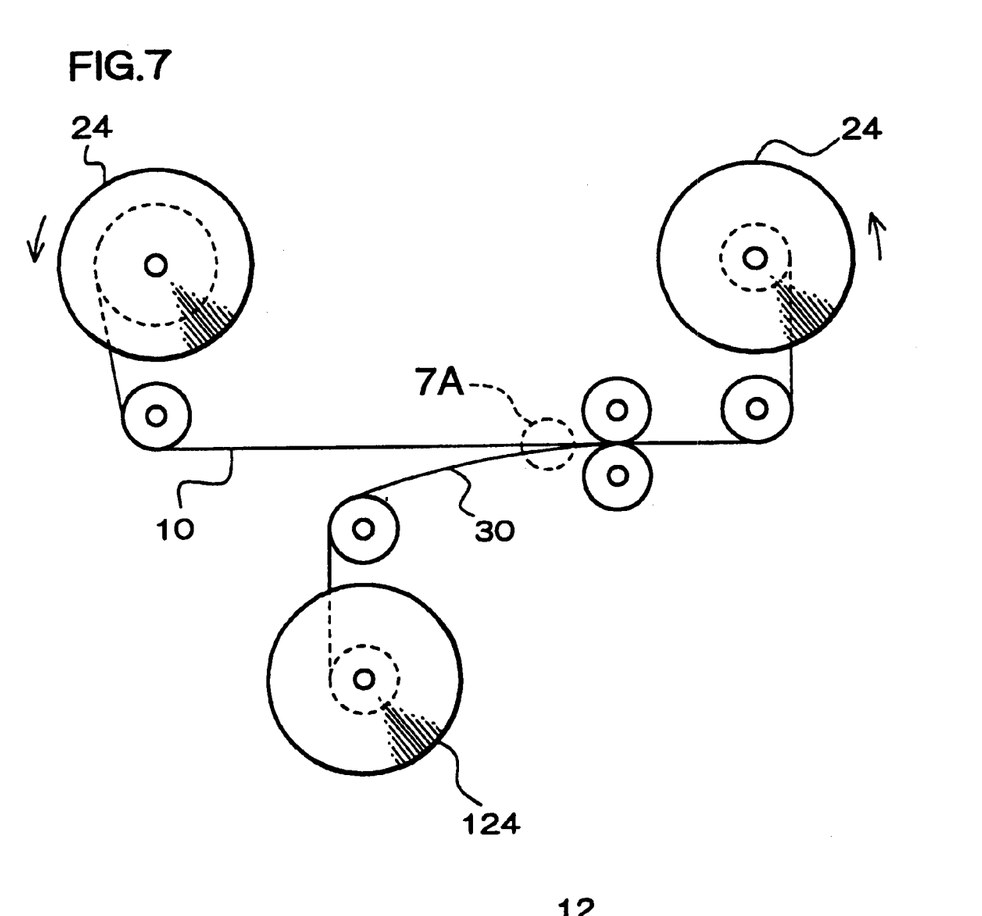
FIG. 7 shows a step in the process after the fabrication of a tape carrier in the method of manufacturing a semiconductor device of the present invention.
Figure 7A:
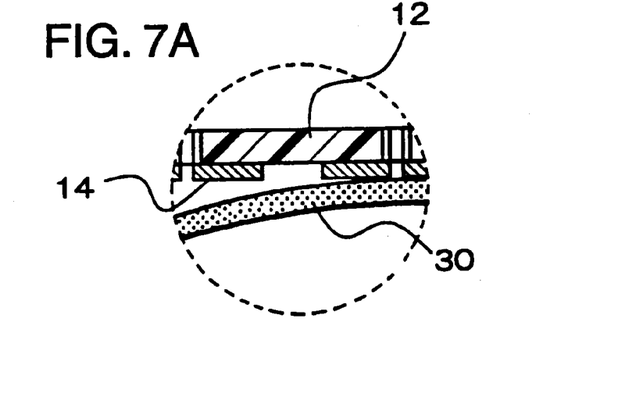

FIG. 7 shows the step of providing the anisotropic conductive film on the tape carrier. The tape carrier 10, as shown in FIG. 7, is wound around a reel 24, to be taken up on another reel 24. That is to say, in the present embodiment, a reel-to-reel process is used. Then between the two reels 24, an anisotropic conductive film 30 is adhered to the tape carrier 10. In this case, the anisotropic conductive film 30 is preferably provided in tape form, wound around a reel 124. Then when the anisotropic conductive film 30 has been continuously applied to the tape carrier 10, the tape carrier 10 is temporarily wound up.

Here the anisotropic conductive film 30 is an adhesive (binder) in which conductive particles (conductive filler) are dispersed, and may also include a dispersant additive. The anisotropic conductive film 30 may first be made into sheet form, then adhered to the tape carrier 10, or may be applied in liquid form. It should be noted that a thermosetting adhesive is commonly used as the adhesive of the anisotropic conductive film 30. The anisotropic conductive film 30 is provided at least on the bonding portions 14. The anisotropic conductive film 30 may be provided to avoid the bonding portions 14 constituting a matrix 13 for which presence of a join 21 is indicated by join marks 23.

Figure 8A:
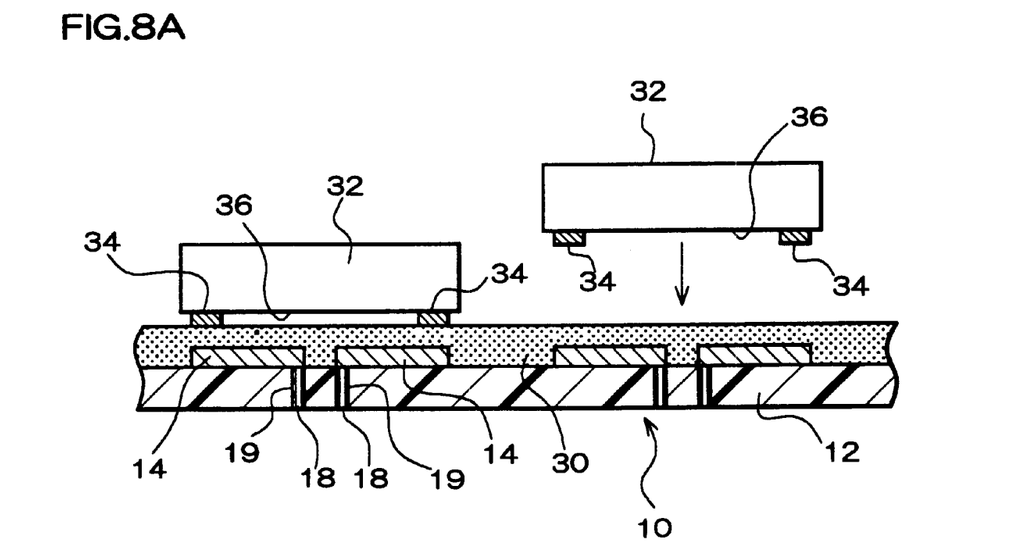
FIGS. 8A and 8B shows a step in the process after the fabrication of a tape carrier in the method of manufacturing a semiconductor device of the present invention.

Next, as shown in FIG. 8A, on the anisotropic conductive film 30, a plurality of the semiconductor chips 32 are mounted. As described above, on the tape carrier 10, bonding portions 14 are formed in a plurality of rows and a plurality of columns to constitute a matrix 13, and on each bonding portion 14 is mounted an individual semiconductor chip 32. However, the semiconductor chips 32 are not mounted on bonding portions 14 constituting a matrix 13 delimited by join marks 23.

On the semiconductor chips 32 are provided a plurality of electrodes 34, and the surface 36 on which the electrodes 34 are provided is mounted on the anisotropic conductive film 30. The bonding portions 14 are formed to correspond to the layout of the electrodes 34, and the electrodes 34 are positioned for mounting the semiconductor chip 32. For this positioning, the positioning holes 20 can be utilized. It should be noted that on the bonding portions 14, at positions corresponding to the electrodes 34, lands are preferably formed with greater width than other portions.

On the anisotropic conductive film 30, the semiconductor chips 32 may be mounted one at a time, or a plurality of the semiconductor chips 32 may be mounted simultaneously. For example, the number of semiconductor chips 32 corresponding to the plurality of bonding portions 14 constituting the matrix 13 may be mounted simultaneously.

It should be noted that the semiconductor chips 32 may be such as to have electrodes 34 formed on two edges only, or may be formed to have electrodes 34 formed on four edges. The electrodes 34 commonly employ projections of gold or solder or the like provided on aluminum pads, but projections may be provided on the bonding portions 14, or the bonding portions 14 may be etched to form projections.

By means of the above process, between the surface 36 of the semiconductor chip 32 on which the electrodes 34 are formed and the surface of the rectangular substrate on which the bonding portions 14 are formed is interposed with the anisotropic conductive film 30. Even when the semiconductor chips 32 are mounted one at a time, it is preferable to proceed to the next step in the process after all of the semiconductor chips 32 have been mounted. It is preferable to proceed to the next step in the process once the above steps are completed, and after the tape carrier 10 has been wound around the reel 24.

Figure 8B:
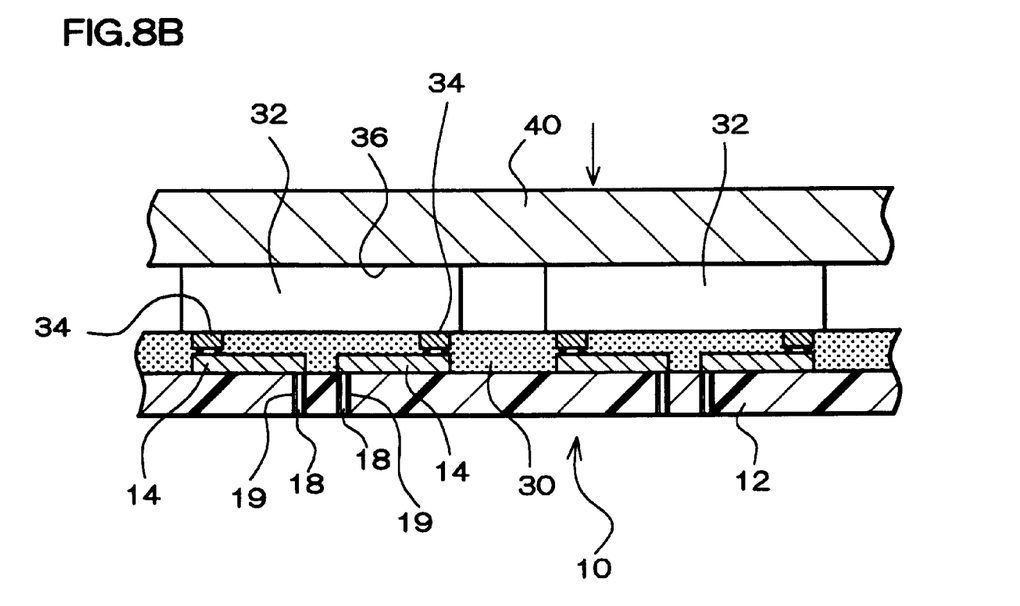

Next, as shown in FIG. 8B, a jig 40 is pressed against the surface opposite to the surface 36 of the semiconductor chip 32 on which the electrodes 34 are formed, and the semiconductor chip 32 is pressed in the direction of the bonding portions 14. The jig 40 has an internal heater, not shown in the drawings, and heats the semiconductor chip 32. It should be noted that as shown in the drawing, a plurality of the semiconductor chips 32 may be pressed in a single operation, or each semiconductor chip 32 may be pressed individually.

In this way, the electrodes 34 of the semiconductor chip 32 and the bonding portions 14 are electrically connected by the interposition of the conductive particles of the anisotropic conductive film 30. According to the present embodiment, at the same time that the bonding portions 14 and electrodes 34 are electrically connected by the anisotropic conductive film 30, filling between the semiconductor chip 32 and substrate 12 with a resin is simultaneously carried out. As a result, a semiconductor device can be fabricated by a method having superior reliability and manufacturability.

Since the semiconductor chip 32 is heated by the jig 40, the adhesive of the anisotropic conductive film 30 is cured at least in the contact region 36 of the semiconductor chip 32 with the surface. This assumes, however, that a thermosetting adhesive is used. If the curing mechanism of the anisotropic conductive film 30 is different, a means for applying the appropriate form of energy is used to realize the anisotropic conductivity.

Figure 9:
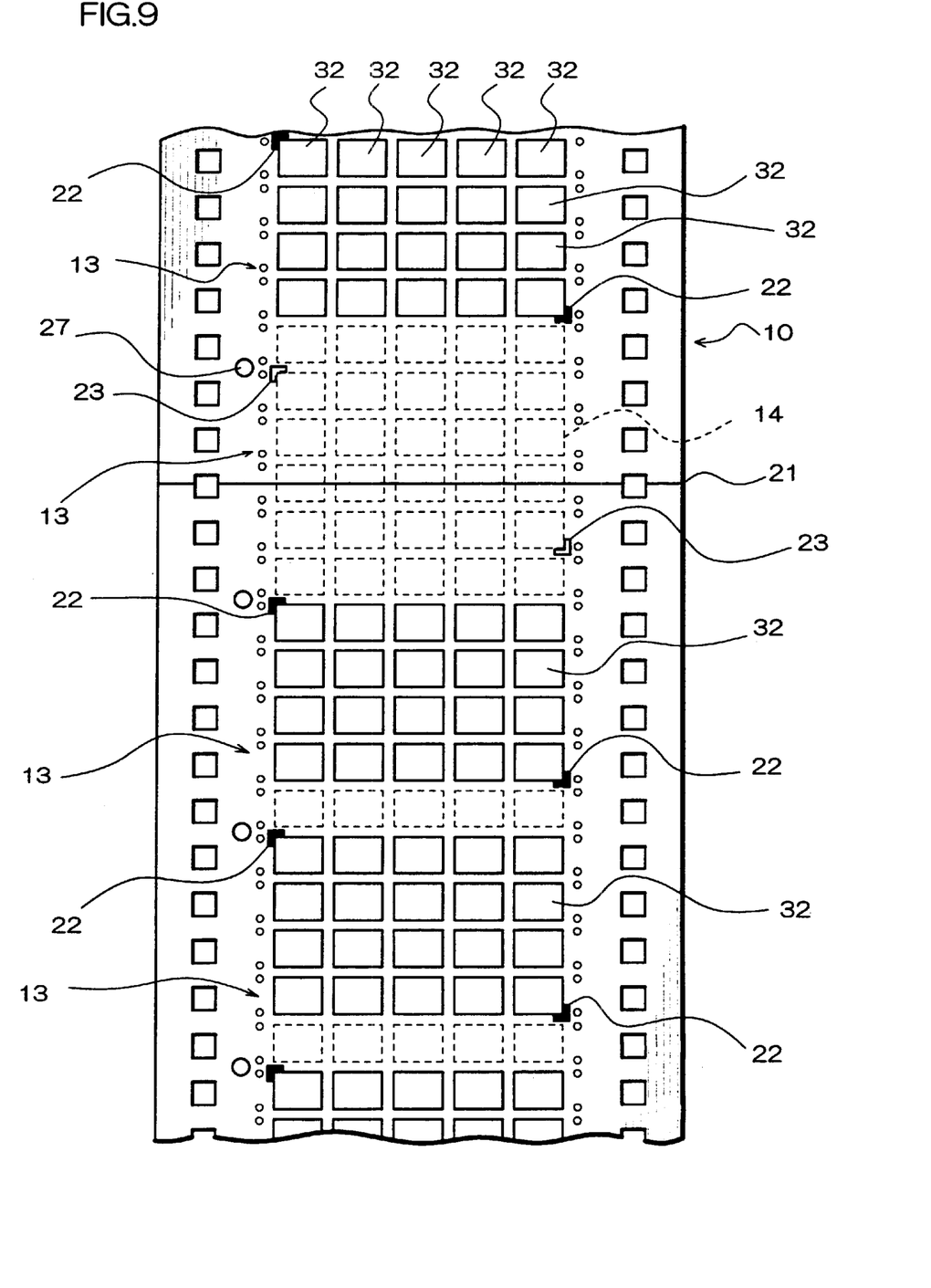
FIG. 9 shows a step in the process after the fabrication of a tape carrier in the method of manufacturing a semiconductor device of the present invention.

FIG. 9 shows the tape carrier 10 on which the semiconductor chips 32 are mounted. In this figure, as described above, no semiconductor chips 32 are mounted on the bonding portions 14 constituting the matrix 13 where join marks 23 indicate the position of join 21. Between adjacent matrices 13, no semiconductor chips 32 are mounted on one row of the bonding portions 14 in the width direction of the substrate 12. In this state, the tape carrier 10 is wound around the reel 24 and proceeds to the next step.

In this step, in locations where rejoining has taken place, for the purposes of step examination, semiconductor chips may be mounted, or with all of these locations as defective locations, semiconductor chips may not be mounted, or all defective semiconductor chips may be mounted. In any case, a means for detecting the join marks 23 is first provided, and when the join marks 23 are detected the procedure determines the action to be taken.

Figure 10:
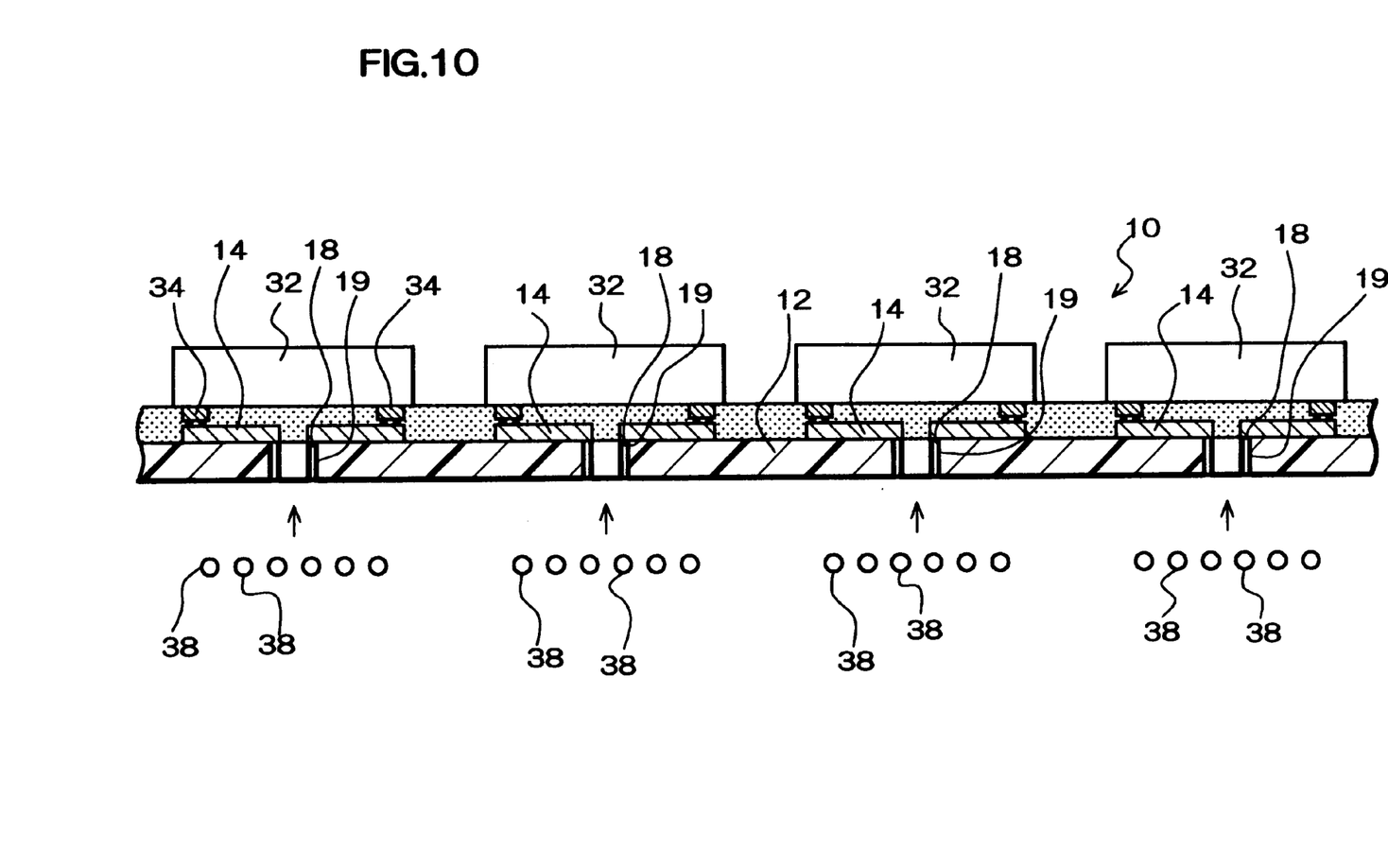
FIG. 10 shows a step in the process after the fabrication of a tape carrier in the method of manufacturing a semiconductor device of the present invention.

Next, as shown in FIG. 10, external electrodes are formed on the tape carrier 10. Solder balls 38 are used as the external electrodes. The solder balls 38 are mounted on through holes 18 on the surface of the substrate 12 of the tape carrier 10 opposite to that of the bonding portions 14, and are electrically connected to an electrically conducting material 19 formed on the internal surfaces of the through holes 18. In this case, using the positioning holes 20, the positioning of the solder balls 38 can be carried out. It should be noted that on the tape carrier 10, lands connected to the electrically conducting material 19 may be formed on the surface on which the solder balls 38 are mounted.

In the present embodiment, for each matrix 13 delimited by the identification marks 22 shown in FIG. 9, the solder balls 38 of the corresponding plurality of the semiconductor chips 32 are mounted simultaneously. That is to say, all of the solder balls 38 for the 4×5 bonding portions 14 forming the matrix 13 are mounted simultaneously. By this means, the time required for mounting the solder balls 38 is reduced, and the adaptability to quantity production can be improved.

Thus in the present embodiment solder balls 38 are mounted for each of the matrices 13. But on the join 21 shown in FIG. 9, solder balls 38 cannot be mounted because of the presence of adhesive tape and the like. It is possible to consider mounting the solder balls 38 so as to avoid only the vicinity of the join 21, but in this case, processing cannot be performed for each of the matrices 13.

Tn the present embodiment, for the matrix 13 positioned at the join 21, a means for detecting the join marks 23 is provided in the process, and solder balls are not mounted, not only on the bonding portions 14 positioned at the join 21, but also on the whole of the matrix 13 defined by the join mark 23. That is to say, for the matrix 13 delimited by the join marks 23 shown in FIG. 9, solder balls 38 are not mounted. Then for the matrices 13 other than the matrix 13, in which the join 21 is positioned, solder balls 38 are mounted. By this means, the mounting of solder balls 38 on the adhesive tape and the like provided on the join 21 can be avoided. As a result, flowing of the solder balls 38 onto other portions, causing short-circuiting of the bonding portions 14 can be prevented.

It should be noted that as external electrodes in place of the solder balls 38, for example, cream solder may be provided by a printing method.

Thus, the tape carrier 10 with the solder balls 38 provided as external electrodes is wound around the reel 24 and advances to the next step. It should be noted that as necessary, after forming the solder balls 38, cleaning, marking and curing are carried out. In these steps also, as necessary, the positioning holes 20 can be used for carrying out positioning.

Figure 11:
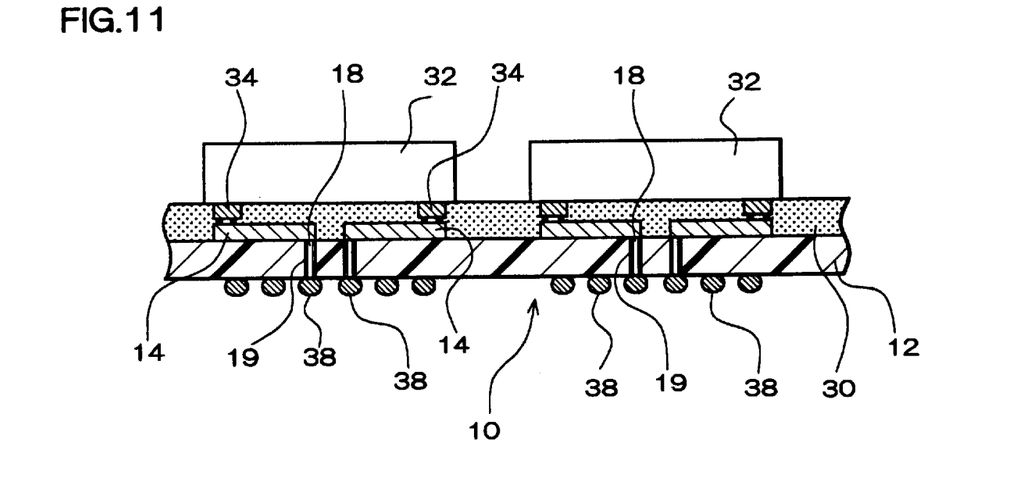
FIG. 11 shows a step in the process after the fabrication of a tape carrier in the method of manufacturing a semiconductor device of the present invention.

As a result of the above process, as shown in FIG. 11, on the tape carrier 10 are mounted the semiconductor chips 32 for each of the bonding portions 14. The electrodes 34 of the semiconductor chip 32 and the bonding portions 14 are electrically connected by the anisotropic conductive film 30. On the opposite surface of the substrate 12 from the bonding portions 14, the solder balls 38 are provided, electrically connected to the bonding portions 14 by the electrically conducting material 19 on the inside surfaces of the through holes 18. Therefore, each of the plurality of rows and plurality of columns of the semiconductor chips 32, has solder balls 38 electrically connected to the electrodes 34. Therefore, in respect of each semiconductor chip 32, a semiconductor device is constituted. Therefore, when the tape carrier 10 is cut for each individual semiconductor chip 32, it forms a completed individual semiconductor device. When cutting out the tape carrier 10, the positioning holes 20 can be used to carry out positioning.

Figure 12:
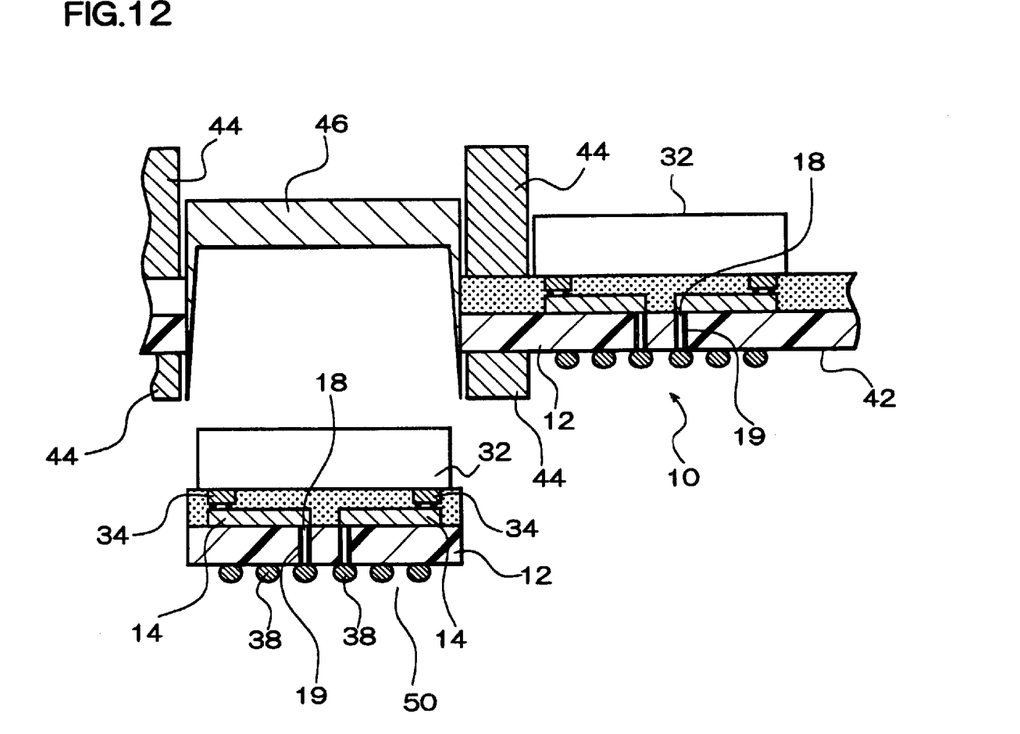
FIG. 12 shows a step in the process after the fabrication of a tape carrier in the method of manufacturing a semiconductor device of the present invention.

FIG. 12 shows the step of cutting out the tape carrier 10. In this figure, a fixed jig 44 such as a fixed blade is fixed to straddle around the periphery of each semiconductor chip 32 on the substrate 12. Then a movable jig 46 such as a movable blade is used to punch out the periphery of the semiconductor chip 32. In this way, individual semiconductor devices 50 are obtained.

The semiconductor devices 50 may as necessary be subjected to visual examination, electrical characteristic testing examination, burn-in, and so forth.

According to the present embodiment, since the bonding portions 14 are electrically connected to the electrodes 34 by the anisotropic conductive film 30, the semiconductor devices 50 can be fabricated by a method having superior reliability and manufacturability. A plurality of bonding portions 14 are sequentially formed in the width direction of the tape carrier 10, and a semiconductor chip 32 is connected for each bonding portion 14. Therefore, since a plurality of the semiconductor chips 32 is mounted in a matrix, the present embodiment is suitable for quantity production of the semiconductor devices 50.

The tape carrier 10 is provided wound around the reel 24, and application of the anisotropic conductive film 30, the mounting and pressing of the semiconductor chips 32, the formation of the external electrodes 38, and the cutting out of individual devices is carried out reel-to-reel. It should be noted that instead of all of these steps being carried out reel-to-reel, at some point the tape carrier 10 may be cut into rectangular sheets. The timing of this cutting may be, for example, any of the following: after the anisotropic conductive film 30 is provided and before mounting the semiconductor chips 32, after mounting the semiconductor chips 32 and before pressing the semiconductor chips 32, after pressing the semiconductor chips 32 and before mounting the solder balls 38, after mounting the solder balls 39 and before cutting out individual devices. A row of bonding portions 14 in the width direction formed between adjacent matrices 13 may be selected as a position for cutting into rectangular sheets.

According to the present embodiment, the fabrication process can be advanced for each matrix 13 delimited by identification marks 22. For example, for each matrix 13, a plurality of solder balls 38 can be formed simultaneously for the plurality of semiconductor chips 32. By forming the solder balls 38 simultaneously for the plurality of semiconductor chips 32, the adaptability to quantity production is improved. By providing a means for detecting the join marks 23, this process also can be carried out eliminating the matrix 13 delimited by the join marks 23. Therefore, flowing of the solder balls 38 by the adhesive tape and the like provided on the join 21 can be prevented. In this way, the semiconductor devices 50 can be efficiently produced in quantity.

Figure 13:
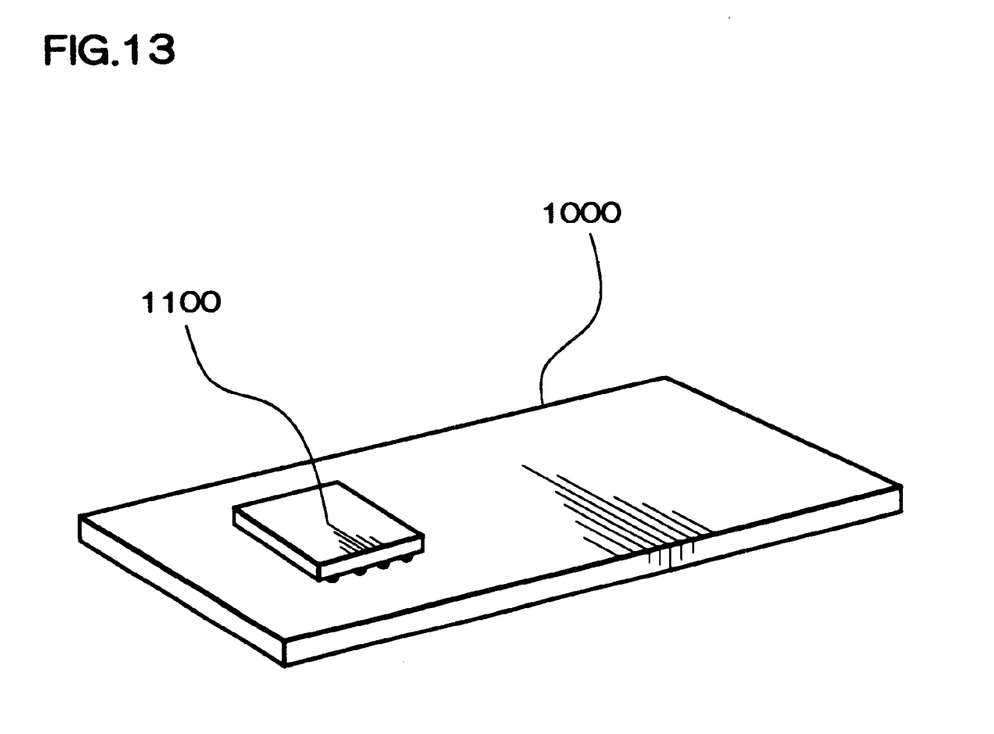
FIG. 13 shows a circuit board on which the semiconductor device of the embodiment of the present invention is mounted.

In FIG. 13 is shown a circuit board 1000 on which is mounted a semiconductor device 1100 fabricated by the method of the above-described embodiment. An organic substrate such as a glass epoxy substrate is generally used for the circuit board. on the circuit board 1000, a bonding portion of for example copper is formed to constitute a desired circuit. This bonding portion and external electrodes of the semiconductor device 1100 are mechanically connected, to achieve the electrical conduction.

It should be noted that since the semiconductor device 1100 can be made as small in surface area as to be mounted as a bare chip on the mounting surface, the electronic instrument can be made compact by using the circuit board 1000 as the electronic instrument. Further, within the same area, more mounting space can be made available, and higher functionality can be achieved.

Figure 14:
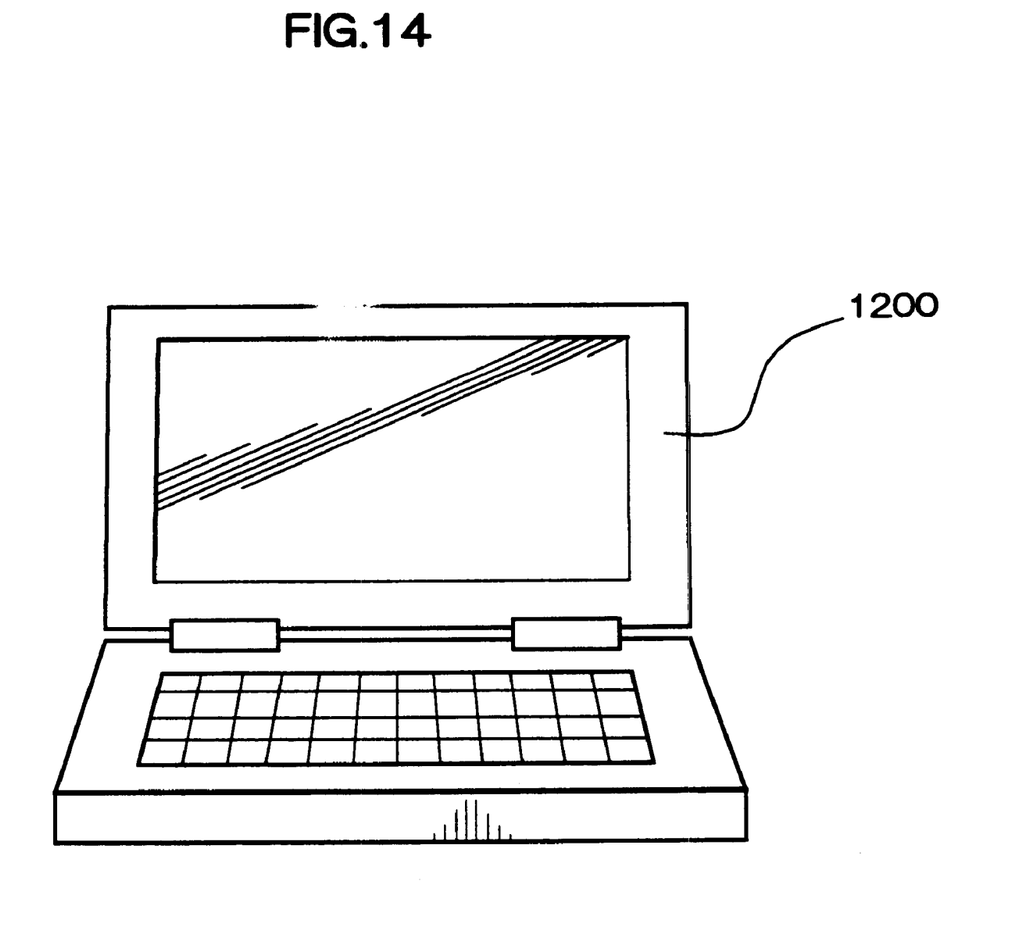
FIG. 14 shows an electronic instrument equipped with the circuit board on which the semiconductor device of the embodiment of the present invention is mounted.

As an electronic instrument provided with this circuit board 1000, FIG. 14 shows a notebook personal computer 1200. It should be noted that regardless of whether active components or passive components, the present invention can be applied to various surface-mounted electronic components. As electronic components, for example, may be cited resistors, capacitors, coils, oscillators, filters, temperature sensors, thermistors, varistors, variable resistors, and fuses.

What is claimed is:

1. A tape carrier comprising:

a substrate;

bonding portions arranged so as to form a plurality of matrixes on the substrate; and identification marks that regularly delimit the matrixes of bonding portions.

2. The tape carrier as defined in claim 1, wherein:

said substrate has a join of its portions; and a join mark is formed in a delimited portion including said join.

3. The tape carrier as defined in claim 2, wherein said join mark is formed by punching out any of said identification marks.

4. The tape carrier as defined in claim 3, having at least two types of identification marks of different forms, said identification marks being detected by different examination means.

5. The tape carrier as defined in claim 2, having at least two types of identification marks of different forms, said identification marks being detected by different examination means.

6. The tape carrier as defined in claim 1, having at least two types of said identification marks of different forms which are detected by different examination means.

* * * * *